US 6,606,234 B1

(12) United States Patent
Divakar

(10) Patent No.: US 6,606,234 B1
(45) Date of Patent: Aug. 12, 2003

(54) ELECTROSTATIC CHUCK AND METHOD FOR FORMING AN ELECTROSTATIC CHUCK HAVING POROUS REGIONS FOR FLUID FLOW

(75) Inventor: Ramesh Divakar, Shrewsbury, MA (US)

(73) Assignee: Saint-Gobain Ceramics & Plastics, Inc., Worcester, MA (US)

(*) Notice: Subject to any disclaimer, the term of this patent is extended or adjusted under 35 U.S.C. 154(b) by 221 days.

(21) Appl. No.: 09/655,324

(22) Filed: Sep. 5, 2000

(51) Int. Cl.[7] .............................................. C23C 16/00
(52) U.S. Cl. ..................................................... 361/234
(58) Field of Search ......................................... 361/234

(56) References Cited

U.S. PATENT DOCUMENTS

| | | | | |
|---|---|---|---|---|
| 4,810,889 A | * | 3/1989 | Yokomatsu et al. | 250/491.1 |
| 5,542,559 A | | 8/1996 | Kawakami et al. | 216/67 |
| 5,720,818 A | * | 2/1998 | Donde et al. | 118/500 |
| 5,835,334 A | | 11/1998 | McMillin et al. | 361/234 |
| 5,904,776 A | * | 5/1999 | Donde et al. | 118/500 |
| 5,916,689 A | | 6/1999 | Collins et al. | 428/463 |
| 6,004,752 A | * | 12/1999 | Loewy et al. | 435/6 |
| 6,022,807 A | * | 2/2000 | Lindsey et al. | 216/38 |
| 6,045,753 A | * | 4/2000 | Loewy et al. | 422/102 |
| 6,368,674 B1 | * | 4/2002 | Loewy et al. | 427/469 |

FOREIGN PATENT DOCUMENTS

| | | | |
|---|---|---|---|
| EP | 0 791 956 | 8/1997 | H01L/21/68 |
| WO | WO 99/65136 | 12/1999 | H02N/13/00 |

OTHER PUBLICATIONS

Field, J., "Electrostatic Wafer Clamping for Next–Generation Manufacturing," *Solid State Technology*, 91, 92, 94, 96, and 98 (Sep., 1994).
Hartsough, L.D., "Electrostatic Wafer Holding," *Solid State Technology*, 87–90 (Jan. 1993).
Wright, R., "SEMATECH's Electrostatic Chuck Project," *TI Technical Journal*, 11(6):40–47 (1994). Nov. 1994.

* cited by examiner

*Primary Examiner*—Bao Q. Vu
(74) *Attorney, Agent, or Firm*—Toler, Larson & Abel, LLP

(57) ABSTRACT

An electrostatic chuck includes a chuck body having a chucking surface and a back surface, an electrode within the chuck body and at least one conduit for providing fluid communication between the back surface and a chucking surface. The conduit includes a porous region which is integrated with the chuck body. During operation, the temperature of a wafer supported by the electrostatic chuck can be controlled or modified by directing a heat transfer fluid, through the porous region, to the chucking surface. The porous region prevents or minimizes plasma penetration and arcing problems. Also described are methods of fabricating an electrostatic chuck having a porous region.

45 Claims, 4 Drawing Sheets

ELECTROSTATIC CHUCK AND METHOD FOR FORMING AN ELECTROSTATIC CHUCK HAVING POROUS REGIONS FOR FLUID FLOW

BACKGROUND OF THE INVENTION

Wafer manufacturing frequently requires accurate control of the wafer temperature. For example, during plasma applications such as deposition or etching, heat is removed from the wafer, typically by a heat transfer gas. Most commonly, the heat transfer gas employed is helium.

In one conventional approach the wafer is mechanically clamped from the periphery of its top surface and helium pressure is supplied from the bottom side of the wafer. This technique can result in wafer non-uniformities and bowing.

Other approaches rely on electrostatic wafer holding. Both coulombic and Johnson-Rahbek types of electrostatic chucks can be employed during processing to secure a wafer or another workpiece, such as, for example, flat panel displays, onto a chucking surface. Some of the available electrostatic chuck designs include an electrode and an insulating or semiconducting layer of material between the electrode and the chucking surface and through-holes for passing helium gas from the back surface to the chucking surface.

While electrostatic forces can be distributed uniformly over the entire chuck surface, thereby ameliorating wafer bowing, plasma can penetrate the helium through-holes and sometimes can extinguish itself. Furthermore, helium arcing can occur through the straight line path between the back surface of the chuck and the electrode.

In one available design a heat transfer fluid pathway is provided in a conductive chuck pedestal, typically fabricated from aluminum metal and overlaid by a dielectric layer, typically formed by spray-coating a ceramic material such as alumina or alumina/titania. The pathway can include a porous dielectric insert which can isolate the conductive pedestal from the pathway. While this design addresses problems relating to arcing and breakdown of helium in a RF plasma environment, it utilizes mechanical means of securing the insert within the pathway. For example, the insert can be held in a dielectric sleeve or secured within the pathway by a press or interference fit. Careful machining is required to provide this fit. Care must be exercised also during spray coating of the dielectric layer onto the combination of aluminum and porous dielectric surfaces as well as in forming heat transfer gas channels through the dielectric layer. Additional complications are associated with preventing undesirable cracking of the dielectric layer during the manufacture or operation of the chuck.

Therefore a need exists for an electrostatic chuck and a method of fabricating the electrostatic chuck which minimizes or overcomes the above-mentioned problems.

SUMMARY OF THE INVENTION

The present invention is related to an electrostatic chuck and to a method of fabricating an electrostatic chuck. The electrostatic chuck of the invention includes a chuck body having a back surface and a chucking surface. The electrostatic chuck also includes an electrode within said chuck body. The electrostatic chuck further includes at least one conduit for providing fluid communication between the back surface and the chucking surface. At least a portion of the conduit includes a porous region which is integrated with the chuck body.

In one embodiment of the invention the chuck body is a ceramic body. In another embodiment, the porous region has a chemical composition which is essentially the same as the chemical composition of the ceramic body. In a further embodiment, the porous region extends from the back surface to the chucking surface.

One method of fabricating an electrostatic chuck includes forming a green body of an electrostatic chuck body. The green body has at least one region which includes removable particles. The method further includes heating the green body to form the electrostatic chuck body and removing the particles, thereby forming a porous region in the electrostatic chuck body. The particles can be removed, for example, by heating or by treatment with a decomposing chemical agent.

Another method of fabricating an electrostatic chuck includes forming in a green body of an electrostatic chuck body at least one green region which, following densification of the green body, will be porous. The method also includes densifying the green body, thereby forming the ceramic electrostatic chuck body which includes at least one porous region.

In one embodiment of the invention the green region includes a sintering aid. In another embodiment of the invention the green region includes a polymeric component which during densification of the green body decomposes thereby leaving pores and forming the porous region of the electrostatic chuck body.

The invention has many advantages. For example, the electrode of the electrostatic chuck of the invention is within the chuck body and thus well isolated from the plasma environment. The porous region within the conduit for directing a heat transfer fluid to the chucking surface minimizes plasma penetration into the conduit and possible plasma extinguishing. The porous region also provides interconnecting channels and pores which are not in a straight line path thereby minimizing arcing problems. At the same time, due to the conductance of the porous region, heat transfer fluid can flow through the pores and channels in enough volume to affect the temperature of the work-piece supported onto the electrostatic chuck. Furthermore, the porous region is not held in place by mechanical means such as a sleeve or through an interference or press fitting, which require careful machining, but is an integral part of the chuck body. The invention also provides simple methods of manufacturing the electrostatic chuck of the invention.

DETAILED DESCRIPTION OF THE INVENTION

The features and other details of the invention, either as steps of the invention or as combination of parts of the invention, will now be more particularly described with reference to the accompanying drawings and pointed out in the claims. The same numeral present in different figures represents the same item or an equivalent item. It will be understood that the particular embodiments of the invention are shown by way of illustration and not as limitations of the invention. The principle feature of this invention may be employed in various embodiments without departing from the scope of the invention.

The invention relates to an electrostatic chuck and to methods of fabricating an electrostatic chuck.

Figure 1:
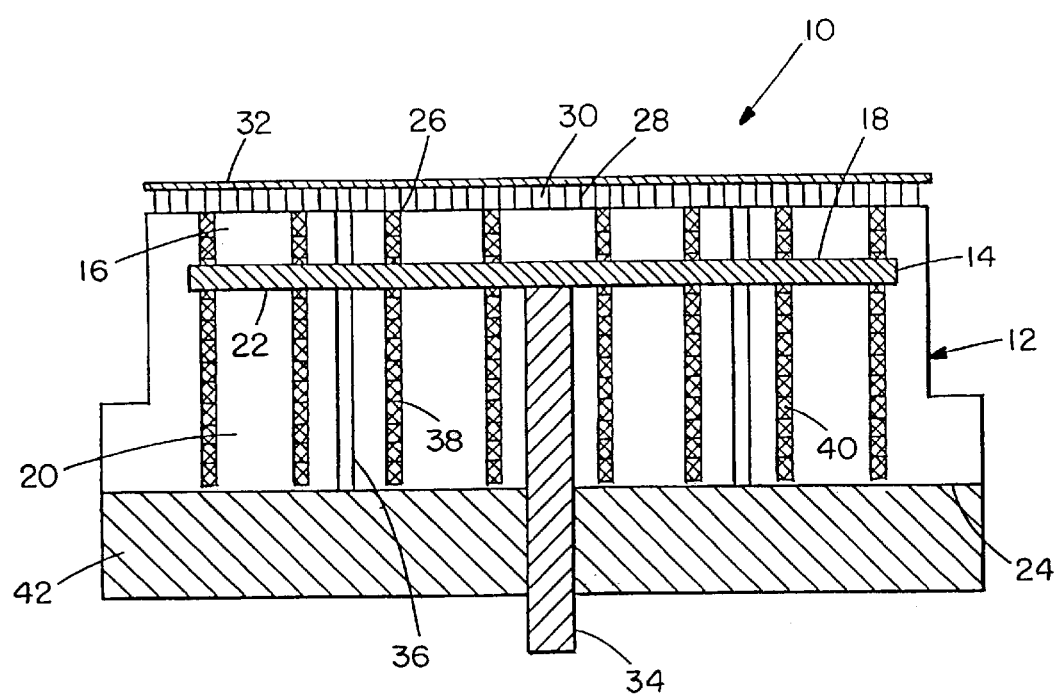
FIG. 1 is a vertical cross sectional view of one embodiment of an electrostatic chuck of the invention.
Figure 2A:
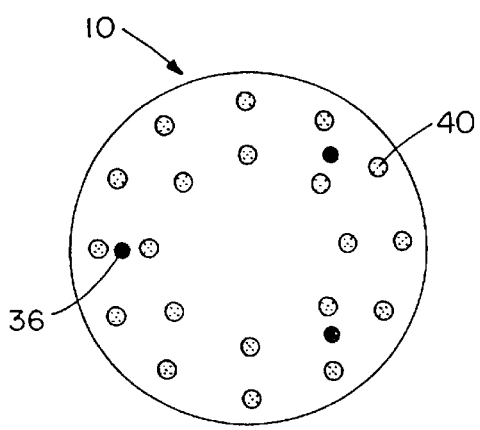
FIG. 2 is a horizontal cross sectional view of electrostatic chucks of the invention.
Figure 2B:
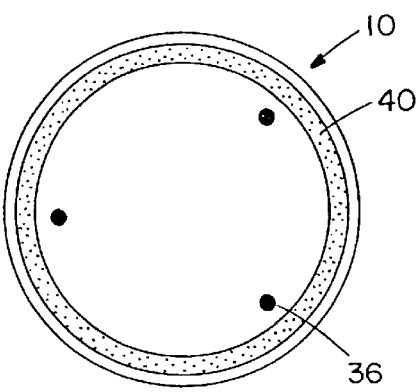
Figure 2C:
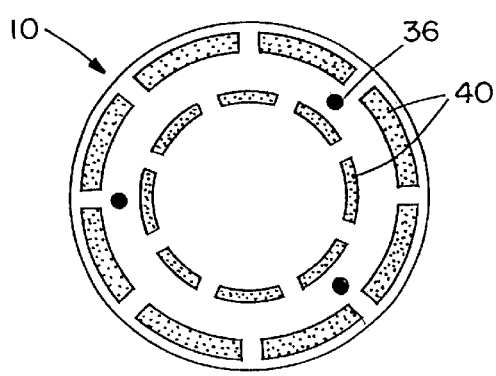
Figure 2D:
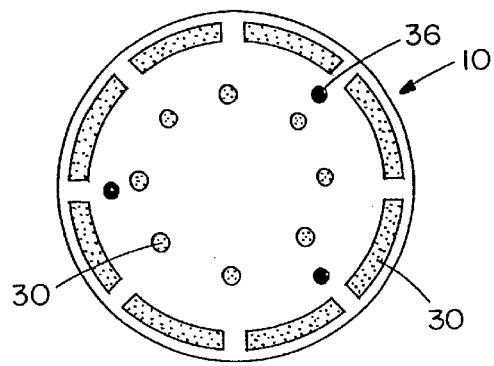
Figure 2E:
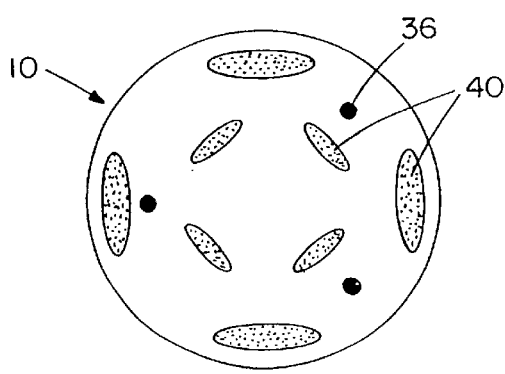
Figure 2F:
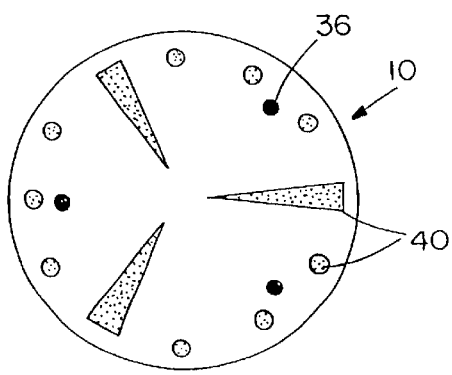

FIG. 1 is a cross sectional view of one embodiment of the invention, represented as electrostatic chuck 10. Electrostatic chuck 10 can be, for example, of Coulombic type or of Johnson-Rahbek type, with the latter being preferred. Electrostatic chuck 10 includes chuck body 12 and, within chuck body 12, electrode 14.

Electrode 14 can be a foil, a plate, a perforated foil or a perforated plate, a mesh, a screen printed layer or can have some other configuration that is suitable for incorporation into electrostatic chucks. Electrode 14 can be used as a chucking electrode, a plasma generating electrode or both. If the electrode operates as a chucking electrode only, a preferred thickness of the electrode is in a range of between about 10 $\mu$m (micrometers or microns) and about 50 $\mu$m. Generally, a plasma generating electrode is thick enough to withstand the radio frequency (RF) applied to it. The preferred thickness of a plasma generating electrode ranges from about 50 $\mu$m to about 1 mm (millimeters). A suitable example of a mesh electrode has a wire diameter of about 125 $\mu$m and a mesh spacing of 50 wires per inch. In one embodiment, electrode 14 is a flat film electrode such as described in U.S. Provisional Patent Application No. 60/169,859, Electrostatic Chucks with Flat Film Electrode, filed Dec. 9, 1999, the entire contents of which are incorporated herein by reference. Monoplolar as well as bipolar electrode configurations, as known in the art, can be employed.

Electrode 14 is fabricated from a suitable metal or from a combination of metals or alloy. In a preferred embodiment, electrode 14 includes molybdenum (Mo), tungsten (W) or combinations of molybdenum and tungsten. Optionally, a Mo, W or Mo—W electrode includes additional metals, such as nickel and cobalt or other components such as sintering activators. Other suitable metals for fabricating of electrode 14 include, but are not limited to, tantalum, platinum, hafnium, rhodium, vanadium and alloys thereof In one embodiment, the electrode material is graphite.

Chuck body 12 includes dielectric layer 16, at upper side 18 of electrode 14, and substrate 20, at lower side 22 of electrode 14. In one embodiment of the invention, electrode 14 is completely and integrally embedded within chuck body 12. In another embodiment, electrode 14 is sandwiched between dielectric layer 16 and substrate 20. A joint or seam (not shown) binds dielectric layer 16 to substrate 20. A joint or seam that does not allow ambient atmosphere to interact with electrode 14 is preferred. In one embodiment of the invention, the joint or seam is formed by employing a suitable brazing material. In another embodiment, the brazing material employed to form the join or seam also functions as electrode 14. Alternatively, there is no joint or seam between dielectric layer 16 and substrate 20.

In one embodiment, the thickness of dielectric layer 16, ranges from about 10 $\mu$m to about 5 mm. In another embodiment, the dielectric resistivity of dielectric layer 16 is greater than $10^{13}$ ohm•cm, at the operating temperature of the chuck, which is particularly suitable in the case of a Coulombic-type chuck. In yet another embodiment, the dielectric resistivity of dielectric layer 16 ranges from about $10^8$ to about $10^{13}$ ohm•cm, at the operating temperature of the chuck, which is particularly suitable for a Johnson-Rahbek-type electrostatic chuck.

Materials which can be employed to fabricate chuck body 12, dielectric layer 16 and/or substrate 20 include but are not limited to aluminum oxide ($Al_2O_3$), aluminum oxide-titanium oxide ($Al_2O_3$—$TiO_2$), aluminum nitride (AlN), silicon nitride ($Si_3N_4$), silicon carbide (SiC), boron nitride (BN), yttrium oxide or yttria ($Y_2O_3$), yttrium aluminate (for example, $Y_3Al_5O_{12}$, $YAlO_3$, $Al_2Y_4O_9$) and any combination thereof. AlN is preferred. In one embodiment of the invention, chuck body 12 has an uniform chemical composition. Alternatively, chuck body 12 can be constructed from different materials; for example, the chemical composition of substrate 20 can differ from that of dielectric layer 16.

Chuck body 12, dielectric layer 16 and/or substrate 20 also can include additional components, for example, sintering aids, bonding agents and other materials, known in the art. Examples of additional components include but are not limited to yttrium oxide ($Y_2O_3$), calcium salts and oxides, for instance, calcium fluoride or $CaF_2$, calcium chloride or $CaCl_2$, calcium oxide or CaO, calcium carbonate or $CaCO_3$, calcium nitrate or $Ca(NO_3)_2$, chromium oxide ($Cr_2O_3$), silica ($SiO_2$), boron nitride (BN) and any combination(s) thereof, as well as secondary phases, formed by reaction(s) between the ceramic material and the additional component(s), such as, for example, compounds including yttrium aluminum and oxygen, for example, $Y_3Al_5O_{12}$, $YAlO_3$, $Al_2Y_4O_9$ or combinations thereof. Compounds which include yttrium aluminum and oxygen are also referred to herein as yttrium aluminates. In one embodiment an AlN chuck body 12, dielectric layer 16 and/or substrate 20 can also include $Al_2O_3$, an oxynitride of aluminum, (for example AlON), $Y_2O_3$, $CaF_2$, $CaCl_2$, CaO, $CaCO_3$, $Ca(NO_3)_2$, $Cr_2O_3$, $SiO_2$, BN, $Y_3Al_5O_{12}$, $YAlO_3$, $Al_2Y_4O_9$ or combinations thereof.

Optionally, electrostatic chuck 10 can further include a heating element (not shown). One suitable arrangement of an electrostatic chuck which includes an embedded heating element is described in U.S. patent application Ser. No. 09/457,968, Electrostatic Chuck, Susceptor and Method for Fabrication, filed on Dec. 9, 1999, the entire contents of which are incorporated herein by reference.

Electrostatic chuck 10 has back surface 24 and chucking surface 26. Optionally, chucking surface 26 includes protrusions 28 and channels 30. A surface pattern such as one including, for example, protruding dimples or ridges significantly reduces contact area between work-piece 32 and chucking surface 26, and allows heat transfer fluid to circulate beneath work-piece 32. Optionally, chucking surface 26 can be coated, for example, for enhanced erosion and/or corrosion resistance. Coatings which can be applied onto chucking surface 26 include but are not limited to pyrolytic BN, yttria, an yttrium aluminate, aluminum trfluoride ($AlF_3$), diamond and diamond-like coatings, such as, for example, coatings applied by chemical vapor deposition (CVD) methods. Thin coatings are preferred, such as, for example, coatings ranging from about 1 micrometer ($\mu$m) to about 100 $\mu$m in thickness.

During operation, power is supplied to electrode 14 through electrical connector 34. Electrical connector 34 is attached to electrode 14 through means known in the art. For example electrical connector 34 can be brazed to electrode 14. In one embodiment of the invention, a contact plug (not shown) is co-sintered to the electrode and joined to electrical connector 34. Contacts and/or electrical connectors that have good electrical conductivity, low RF impedence and are easily joined to electrode 14 are preferred. In one embodiment of the invention, electrical connector 34 includes, at electrode 14, an electrical contact such as described in U.S. patent application Ser. No. 09/457,968, Electrostatic Chuck, Susceptor and Method for Fabrication, filed on Dec. 9, 1999, the entire contents of which are incorporated herein by reference.

Electrostatic chuck 10 also includes one or more lift pin holes 36 which accommodate lift pins typically employed to raise or lower work-piece 32 from chucking surface 26. Generally, lift pin holes 36 extend from back surface 24, through substrate 20, electrode 14, dielectric layer 16, to chucking surface 26. Electrode 14 has apertures which align with lift pin holes 36 but, preferably, are larger in diameter, thereby preventing the lift pins from contacting electrode 14. The number of lift pin holes 36 generally depends on the chuck design and its application.

Electrostatic chuck 10 includes at least one conduit 38 which provides fluid communication between back surface 24 and chucking surface 26. Generally conduit 38 extends from back surface 24, through substrate 20, electrode 14, dielectric layer 16, to chucking surface 26. To accommodate conduit 38 electrode 14 has apertures which align with conduit 38 and, preferably, are larger in diameter, thereby preventing heat transfer gas flowing through conduit 38 from contacting electrode 14. The cross section of conduit 38 can have, for example, a circular, elliptical, ring-like shape or any other suitable shape.

Either or both the shape or dimensions of the cross section of conduit 38 can be essentially constant throughout the thickness of electrostatic chuck 10. Alternatively, either or both the shape or dimensions of conduit 38 can vary between back surface 24 and chucking surface 26.

Conduit 38 includes porous zone or region 40 which is integrated within chuck body 12. Porous region 40 can include a ceramic material such as, for example, AlN, $Si_3N_4$, $Al_2O_3$, $Al_2O_3$—$TiO_2$, SiC. Optionally, porous region 40 can further include one or more components such as, for example, additives, sintering aids or bonding agents. Examples of additional components include but are not limited to yttrium oxide ($Y_2O_3$), calcium salts and oxides, for instance, calcium fluoride or $CaF_2$, calcium chloride or $CaCl_2$, calcium oxide or CaO, calcium carbonate or $CaCO_3$, calcium nitrate or $Ca(NO_3)_2$, chromium oxide ($Cr_2O_3$), silica ($SiO_2$), boron nitride (BN) and any combination(s) thereof. Porous region 40 also can include reaction products, also referred to herein as secondary phases, formed by reaction(s) between the ceramic material and the additional component(s). In a preferred embodiment, porous region 40 includes AlN and an yttrium aluminate, such as, for example, $Y_3Al_5O_{12}$, $YAlO_3$, $Al_2Y_4O_9$ or combinations thereof. Porous region 40 can also include $Al_2O_3$ or an oxynitride of aluminum, for example AlON. In another embodiment, porous region 40 includes AlN and $Y_2O_3$, $CaF_2$, $CaCl_2$, CaO, $CaCO_3$, $Ca(NO_3)_2$, $Cr_2O_3$, $SiO_2$, BN or a combination(s) thereof. Porous region 40 can be fabricated from the same material employed to fabricate dielectric layer 16 or chuck body 12.

Generally porous region 40 has a porosity sufficient to allow a required gas flow to the chucking surface. Pores small enough to restrict plasma penetration into conduit 38 are preferred. Also preferred are pores which do not form a direct line of sight between the backside (side resting on electrostatic chuck 10) of workpiece 32, electrode 14 and cathode pedestal 42, which supports electrostatic chuck 10.

The porosity and average pore size employed can vary depending on the chuck design and/or application of a particular chuck. In one embodiment, the porosity of porous region 40 is in a range of between about 10% and about 60% and preferably in a range of between about 30% and about 50%. In another embodiment, average pore size ranges from about 5 $\mu$m to about 500 $\mu$m, with preferred pores having an average size between from about 20 $\mu$m to about 100 $\mu$m.

Porous region 40 is integrated or integrally bonded to chuck body 12. As used herein, the terms "integrated" or "integrally bonded" mean that porous region 40 is part of chuck body 12. For example, the interface between porous region 40 and chuck body 12 does not present cracks, seams, joints or other defects. In a preferred embodiment, porous region 40 is diffusion-bonded to surrounding chuck body 12. In another preferred embodiment porous region 40 is chemically bonded to surrounding chuck body 12. Porous region 40 can also be sintered into surrounding chuck body 12.

In a preferred embodiment of the invention, a plurality of conduits 38, which include porous region 40, are employed. The number, dimensions and arrangement of porous regions 40 can depend, for example, upon the design and/or application of a particular chuck. Porous regions 40 can but need not have the same porosity. In one embodiment of the invention, most or all of chuck body 12 is porous. Alternatively, most or all of dielectric layer 16 is porous.

In one embodiment, all porous regions 40 have the same shape. In another embodiment all porous regions 40 have the same dimensions. In still another embodiment electrostatic chuck 10 includes porous regions having different shapes. Some suitable cross sectional shapes of porous region 40 are shown in FIG. 3.

In a preferred embodiment, porous region 40 is a porous plug, such as, for example, a cylindrical porous plug. The number, dimensions and arrangement of the porous plugs can depend, for example, upon the design and/or application of a particular chuck. In one embodiment, the diameter of the porous plug ranges from about 0.5 millimeter (mm) to about 20 mm. In another preferred embodiment, electrostatic chuck 10 has between about 1 and about 100 porous plugs, and preferably between about 20 and about 50 porous plugs.

In another preferred embodiment, electrostatic chuck 10 includes porous regions 40 which are concentric rings. In a further embodiment, the surface area at the chucking surface of one ring is greater than the surface area of another ring. In yet another embodiment, the porosity of the ring having the greater surface area is less than that of the ring which has the smaller surface area.

Preferably, porous region 40 prevents the formation of a direct line of sight from workpiece 32 (in particular from the side of workpiece 32 which rests on electrostatic chuck 10) to electrode 14 and to cathode pedestal 42. In one embodiment of the invention, porous region 40, integrally bonded to chuck body 12, extends from back surface 24 to chucking surface 26, as shown in FIG. 1. Alternatively, porous region 40, also integrally bonded to chuck body 12, only partially extends through conduit 38.

Figure 3A:
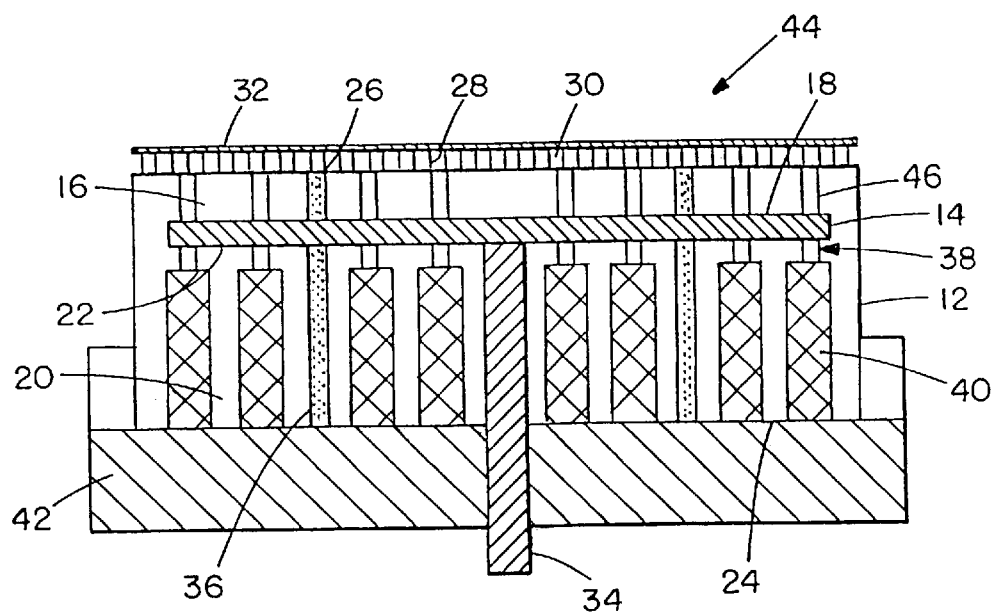
FIGS. 3A and 3B are vertical cross sectional views of other embodiments of electrostatic chucks of the invention.

FIG. 3A is a cross sectional view of one embodiment of the invention, represented as electrostatic chuck 44. Electrostatic chuck 44 includes conduit 38 to provide fluid communication between back surface 24, and chucking surface 26. Conduit 38 includes porous region 40, at back surface 24. Porous region 40 is in the shape of a porous plug and is integrally bonded to substrate 20. Porous region 40 partially extends from back surface 24 through conduit 38, towards, but not all the way to, chucking surface 26. Conduit 38 also includes opening 46, which does not include porous material and which extends from porous zone 40 to chucking surface 26. Porosity and other pore-related properties, the numbers and volume of porous regions 40, the diameter and number of openings 46 are factors which can vary from one chuck design to another, depending on the application and the desired volume flow of heat transfer fluid.

Figure 3B:
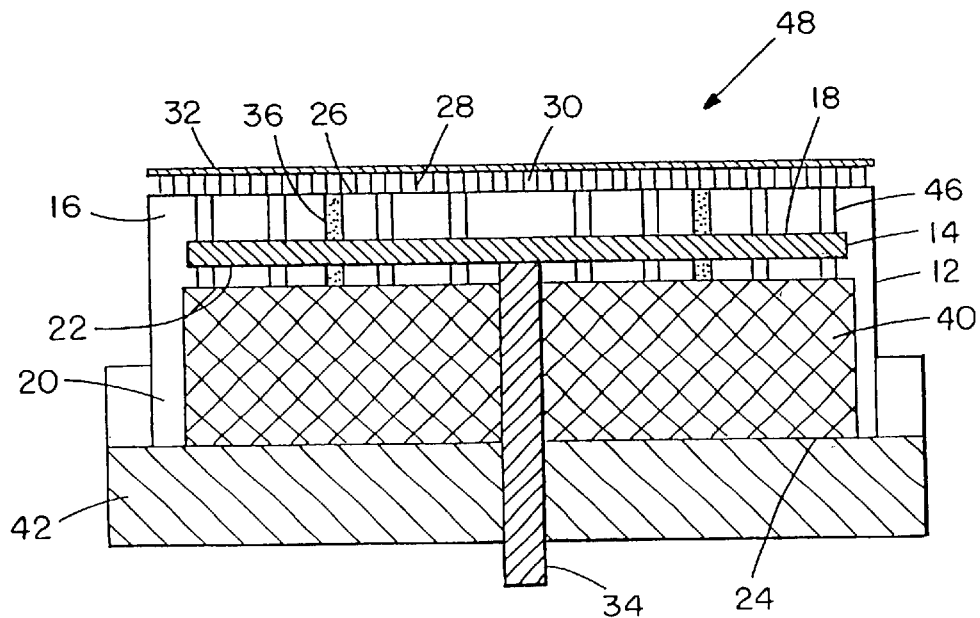

FIG. 3B is a cross sectional view of another embodiment of the invention, represented as electrostatic chuck 48. Electrostatic chuck 48 includes porous region 40 at back surface 24. Porous region 40 is integrally bonded to substrate 20. It partially extends from back surface 24, some distance towards, but not all the way to, chucking surface 26. The cross section of porous region 40 can be, for example, elliptical, a ring or another suitable shape, such as a shape illustrated in FIG. 2. Alternatively, most or the entire volume at back surface 24, extending from back surface 24 towards, but not all the way to, chucking surface 26, can be porous. Electrostatic chuck 48 also includes openings 46, which do not include porous material and extend from porous region 40 to chucking surface 26. As discussed above, porosity and other pore-related properties, numbers and volume of porous regions 40, the diameter and number of openings 46 are factors which can vary from one chuck design to another, depending on the application and the desired volume flow of heat transfer fluid.

In yet other embodiments, (not shown), the porous region is at the chucking surface and is integrally bonded to the dielectric layer of the chuck body. The porous region extends from the chucking surface through the chuck body towards, but not all the way to, the back surface. For example, the porous region extends from the chucking surface through the electrode. One or more openings for directing heat transfer fluid extend from the porous region to the back surface.

Porous regions which partially extend through the conduit between the back surface and the chucking surface and are integrally bonded to the chuck body can be placed in other zones within the conduit, for example, away from both the back surface and the chucking surface. Electrostatic chucks which combine porous regions which extend from back surface to the chucking surface and porous regions which only partially extend through the conduit also can be fabricated.

During the operation of electrostatic chuck 10 shown in FIG. 1, a heat transfer fluid is directed, from back surface 24, through porous region 40 to chucking surface 26. Similarly, in the case of electrostatic chucks 44 and 48, illustrated, respectively, in FIGS. 3A and 3B, a heat transfer fluid is directed from back surface 24, through porous region(s) 40, openings 46 to chucking surface 26.

The heat transfer fluid exits at chucking surface 26 and, optionally, circulates though channels 22, thereby modifying the temperature of work-piece 32. Heat transfer fluid can be supplied from a source, not shown in the figures and directed to porous region 40, for example, through an opening in cathode pedestal 42. Heat transfer fluid can be supplied to porous region 40 via tubings, pipings, regulators, fittings, valves, plenum reservoir(s), any combinations thereof, or other suitable means known in the art.

Examples of heat transfer fluids include, but are not limited to, helium, argon, or other inert gases, as well as gases which are inert in the particular operation, environment and conditions in which electrostatic chuck is employed, and mixtures thereof. The heat transfer fluid can be at a temperature suitable in effecting the desired modification of the work-piece temperature. Heat transfer fluid within a desired temperature range can be supplied to chuck 10 as known in the art, for example by heating of cooling the heat transfer fluid in a heat exchanger, or by using cryogenic fluids. The pressure of heat transfer fluid supplied to conduit 38 can be controlled as known in the art. Preferably, the heat transfer fluid is supplied at a pressure such that the flow of heat transfer fluid exiting at chucking surface 26 does not interfere with the electrostatic forces exerted upon work-piece 32 and the operation of the electrostatic chuck.

As discussed above, design parameters such as, for example, the porosity pore size and volume of the porous regions can be chosen to obtain a desired volume flow. A desired gas conductance is dependent on the size of pores and the amount of porosity in porous region 40. Gas conductance is the volume of gas allowed to flow through at a given pressure. The porosity of a large porous region can be adjusted, for example, to yield an equivalent gas conductance of a small porous plug.

The invention also is related to methods of producing an electrostatic chuck.

Figure 4A:
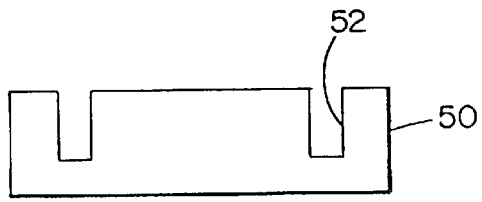
FIGS. 4A–4E are a schematic view of the steps employed by one method of the invention.
Figure 4B:
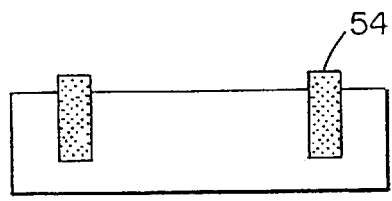

Stages of one embodiment of a method of the invention are shown in FIGS. 4A through 4E. As shown in FIG. 4A, first portion 50 of a green chuck body includes recess 52. As used herein, "green" refers to the pre-densified state of a ceramic precursor. The green chuck body can be a compacted (for example cold-pressed), non-densified body of a precursor, such as, for example a powder or slurry, which upon densification will form a ceramic body. In a preferred embodiment, first portion 50 is formed by compacting AlN powder. Other suitable materials which can be employed include, but are not limited to, AlN, $Si_3N_4$, $Al_2O_3$, $Al_2O_3$—$TiO_2$ or SiC, BN, $Y_2O_3$, yttrium aluminates or any combination thereof Plug 54 is positioned into recess 52, as shown in FIG. 4B. Plug 54 can have any suitable shape, as discussed above. More than one plug 54 can be incorporated in the green body. Optionally, plug 54 can be surrounded by a dense sleeve, which is co-sintered around plug 54.

In one embodiment, plug 54 is a pre-fabricated, porous plug, for example a porous plug already subjected to densification and/or heat treatment, which is inserted into recess 52. Alternatively, plug 54 can be in a green form which can be compacted into recess 52. For instance, plug 54, in its green form can be a powder compacted into recess 52 or can be a cold pressed green pellet molded to fit into recess 52. If plug 54 is in its green form, allowance is made for its shrinkage during densification along with shrinkage of first green portion 50, as is known in the art. If in its green form, plug 54 becomes porous upon densification or as a result of another processing step (for example during heat treatment or soaking) or by treatment with an agent as further described below.

Suitable materials which can be employed to form the green form of plug 54 include, but are not limited to, AlN, $Si_3N_4$, $Al_2O_3$, $Al_2O_3$—$TiO_2$, SiC. AlN, BN, $Y_2O_3$, yttrium aluminates or any combination thereof is preferred. The same material can be employed to form both the green body and the green form of plug 54.

In one embodiment, plug 54, in its green form, includes removable particles. Removable particles can be in the form of powders, beads, granules, spheres, chopped fibers, filaments or can have other suitable shapes. Particles having an uniform size, as known in the art, also can be employed. The amount, shape and particle sizes employed can be selected to result, upon the removal of the particles, in a porous region having a desired porosity and a desired pore size range as discussed above.

Removable particles can include compounds which decompose or burn off at the temperatures employed in the manufacture of electrostatic chucks. For example, removable particles can include organic compounds, polymers, metal complexes, organometallic compounds and other fugitive materials which decompose or burn off, for example during heat treating, soaking, sintering or hot pressing. Clean burning fugitive compounds, which do not cause undesirable emissions are preferred. Particularly preferred are polymers of acrylic or methacrylic acid, for example polymethylmethacrylate (PMMA). Polystyrene, polyethylene, acrylic resins, cellulose acetate, cured epoxy resins, polyimide resins are examples of other materials which can be included in the green body. Copolymers, ter-polymers as well as cross-linked modifications thereof also can be employed.

In another embodiment, removable particles are removed by treatment with a chemical agent. For instance, the green form of plug 54 can include metal particles which can be removed, preferably after densification of the green body, by etching with a suitable chemical agent, for example, a mixture of HF and $HNO_3$. Preferably, a continuous phase of a metal such as, for example, molybdenum (Mo), tungsten (W), rhodium (Rh), vanadium (V), niobium (Nb), hafnium (Hf) and other refractory metals or alloys thereof is employed.

The green form of plug 54 also can include one or more additional components. In a preferred embodiment, the green form of plug 54 includes one or more components that serve as a bonding agent and/or as a sintering aid. Non-limiting examples of additional components which can be included in the green are: $Y_2O_3$, $CaF_2$, $CaCl_2$, CaO, $CaCO_3$, $Ca(NO_3)_2$, $Cr_2O_3$, $SiO_2$, BN, combinations thereof as well as other commonly used sintering aids. In another preferred embodiment, the additional component(s) form a liquid phase during sintering. Alternatively, the green form of plug 54 does not include a sintering and/or bonding agents.

The green form of plug 54 also can be formed from a coarse powder which, upon densification, results in a porous region such as described above.

In one embodiment of the invention, a sintering inhibitor such as magnesium oxide (MgO), silica ($SiO_2$), silicates, such as, for example, aluminum silicate or magnesium silicate, carbon (in excess of the carbon amount required to reduce oxygen) or another suitable sintering inhibitor can be added to a desired region in the green body. The sintering inhibitor prevents complete densification in that region and upon densification conditions, the incompletely densified region is porous.

Figure 4C:
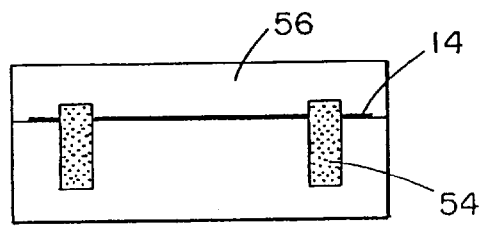

As shown in FIG. 4C, electrode 14 is positioned onto first green portion 50 of the green chuck body. Electrode 14 can be, for example, a mesh electrode, in which case mesh openings can be arranged concentrically around plug 54. Alternatively, electrode 14 can be a screen printed layer, a foil or plate provided with apertures which align concentrically but are larger in diameter than plug 54, thereby preventing the electrode material from contacting plug 54. If a dense sleeve, co-sintered around plug 54, is employed, hole perforation into electrode 14 is simplified since the dense sleeve serves as a barrier between plug 54 and electrode 14.

Second portion 56 of a green chuck body is overlaid onto electrode 14. Second portion 56 includes a dielectric material. Ceramic precursors and additional components which are suitable in forming first portion 50 also can be employed in forming second portion 56. In a preferred embodiment, both first portion 50 and second portion 56 have the same composition.

Figure 4D:
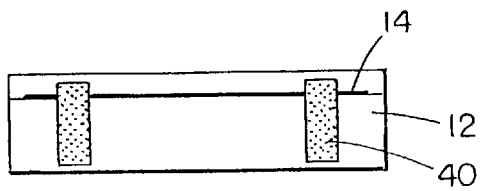

The resulting assembly is densified, for example, by sintering to obtain a dense structure having porous region 40 (in this case a porous plug), which is integrally bonded to chuck body 12 as shown in FIG. 4D. Sintering can be in the absence of pressure (pressure less sintering) or by hot pressing. The sintering temperature can depend on the particular materials employed in the fabrication of the electrostatic chuck. In the case of an AlN compacted powder, the sintering temperature ranges from about 1500° C. to about 2000° C. If sintering is conducted under pressure, the pressure can range from about 10 MPa (mega Pascal) to about 40 MPa. In one embodiment of the invention, a dense sleeve co-sintered to the plug is employed, as described above, thereby preventing a possible collapse of the plug during hot pressing.

Sintering can be under an inert atmosphere, as described in U.S. patent application Ser. No. 09/458,278, titled High-Purity Low-Resistivity Electrostatic Chuck, filed on Dec. 9, 1999, the entire contents of which are incorporated herein by reference. Heat treating steps, as known in the art can also be employed.

Figure 4E:
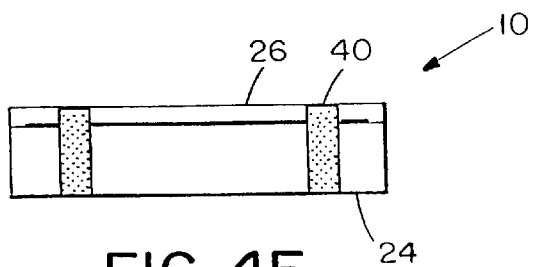

The ends of porous region 40 are exposed at back surface 24 and at chucking surface 26, for example by machining, thereby forming electrostatic chuck 10, shown in FIG. 4E.

A method for obtaining an electrostatic chuck having a partially extended porous region or plug, for example at back surface 26, includes the steps shown in FIGS. 4A and 4B, as described above. First portion 50 of a green chuck body, including plug 54 are then densified, for example, by a method described above, after which they are overlayed by electrode 14 and second portion 56. The resulting assembly is exposed to conditions such, for example, as hot pressing or pressureless sintering, which result in densification of second portion 56. An opening extending from chucking surface 26 to porous region 40 is formed, for example by machining. Alternatively, a pin inserted into the green form of second portion 56, prior to its densification, can be removed, leaving behind the desired opening. The end of porous plug 40 is exposed at back surface 24 as described above.

Another method of producing an electrostatic chuck includes integrating a porous plug into a dense chuck body. The chuck body and the porous plug can be fabricated separately, for example, from materials and by methods described above. In one embodiment of the invention, the porous plug itself is fabricated by densifying a green form of a plug which includes fugitive materials. The plug can include or can be coated with a bonding agent, such as the bonding agents described above. In the case of an AlN chuck bodies and AlN porous plug, $Y_2O_3$, $Y_3Al_5O_{12}$, $YAlO_3$, $Al_2Y_4O_9$ and combinations thereof are preferred. $Al_2O_3$ or oxynitrides of Al also can be employed as bonding agents. Bonding agents amounts, with respect to the porous region, generally range from about 0.5 weight % to about 10 weight %. If a high purity electrostatic chuck is desired, minimum amounts of bonding agents necessary to effect bonding of the plug to the chuck body are preferred.

Integration of the porous plug into the surrounding chuck body can be accomplished by heating to a temperature sufficient to effect diffusion bonding between the porous plug and the chuck body. Alternatively, the temperature can be high enough to soften or to liquify the bonding agent thereby joining the porous plug to the chuck body.

EXEMPLIFICATION

EXAMPLE 1

Fabrication of Porous Plugs Via a Fugitive Based Technique 80 g of spray dried AlN powder containing 3 wt % of $Y_2O_3$ as a sintering aid was dry blended with 20 g of polymethylmethacrylate (PMMA), i.e., 20 wt % of PMMA. The PMMA was in the form of spherical beads approximately 50 μm in diameter. The mixture was then cold pressed at 210 MPa to form several "green" cylindrical plugs approximately 12.5 mm (0.5 in) in diameter and 22 mm (0.86 in) long. A second batch of "green" porous plug precursors was fabricated in identical fashion except that the weight fraction of the 50 μm PMMA was 30%. A third batch of "green" porous plug precursors was fabricated in identical fashion except that the size of the PMMA beads was approximately 100 μm (−120/+170 mesh) and the weight fraction of PMMA used was 30%. In order to remove the binders from the green body, each batch of green plug precursors was placed in an oven and heated in air to 600° C. at a heating rate of 0.4° C./min, held for one hour at 600° C. and cooled back to room temperature. These plugs were then sintered at 1850° C. for one hour in nitrogen to obtain sintered porous plugs.

One porous plug from each batch was characterized by mercury porosimetry and the results are shown in Table 1.

TABLE 1

| | Fugitive Added: PMMA | | Porous Plug Attributes | |
|---|---|---|---|---|
| Example | Weight Fraction, % | Size, μm | Bulk Density, g/cm$^3$ | Porosity, % |
| 1 | 20 | 50 | 2.31 | 27.3 |
| 2 | 30 | 50 | 1.94 | 40.8 |
| 3 | 30 | 100 | 1.94 | 42.1 |

As can be seen from Table 1, porous plugs based on AlN with porosities of 27 to 42% were obtained.

EXAMPLE 2

Integration and Properties of Porous Plugs

Three equally sized holes, spaced 120° apart, were machined into a 75 mm diameter body of hot-pressed, high purity AlN. Three AlN porous plugs from Example 3 were machined such that their outer diameter matched the diameter of the holes in the AlN body. One porous plug was then inserted into each hole in the AlN body. The assembly was heated in a furnace to 1850° C., soaked at 1850° C. for an hour, and subsequently cooled to room temperature. Upon inspection, it was discovered that all three porous plugs had fused to the AlN body. Air was passed through the porous plugs to verify that the plugs had adequate conductance.

The same experiment was repeated with another identical assembly of porous plugs in an AlN body with the dual purpose of joining the plugs to the AlN body as well as adjusting the resistivity of the AlN body. The assembly was heat treated at 1750° C. for 4 hours in argon and then cooled to room temperature. Once again, the porous plugs had bonded to the main AlN body and had adequate (gas) conductance. In addition, the resistivity of the AlN body was $5 \times 10^{10}$ ohm·cm (measured at room temperature and an electric field of 500 V/mm).

EQUIVALENTS

While this invention has been particularly shown and described with references to preferred embodiments thereof, it will be understood by those skilled in the art that various changes in form and details may be made therein without departing from the scope of the invention encompassed by the appended claims.

What is claimed is:

1. An electrostatic chuck, comprising:
   a) a chuck body having a back surface and a chucking surface;
   b) an electrode within said chuck body; and
   c) at least one conduit providing fluid communication between the back surface and the chucking surface, said conduit including a porous region that is integrated with and extends into said chuck body.

2. The electrostatic chuck of claim 1, wherein the chuck body is a ceramic chuck body.

3. The electrostatic chuck of claim 2, wherein the porous region extends from the back surface to the chucking surface of the electrostatic chuck.

4. The electrostatic chuck of claim 2, wherein the porous region partially extends through said conduit.

5. The electrostatic chuck of claim 3, wherein the porous region is at the back surface.

6. The electrostatic chuck of claim 3 wherein the porous region is at the chucking surface.

7. The electrostatic chuck of claim 2, wherein the chemical composition of the chuck body and of the porous region are essentially the same.

8. The electrostatic chuck of claim 7 wherein the porous region includes a bonding component.

9. The electrostatic chuck of claim 8, wherein the bonding component includes an yttrium aluminate or yttria.

10. The electrostatic chuck of claim 9, wherein the yttrium aluminate includes at least one member selected from the group consisting of $Y_3Al_5O_{12}$, $YAlO_3$ and $Al_2Y_4O_9$.

11. The electrostatic chuck of claim 8, wherein the ceramic chuck body includes a bonding component.

12. The electrostatic chuck of claim 1, wherein the electrode includes an upper side and a lower side, and wherein the chuck body includes:
   a) a first dielectric layer between said upper side and the chucking surface; and
   b) a substrate between said lower side and the back surface,
   said porous region being integrally bonded to either or both said first dielectric layer or said substrate.

13. The electrostatic chuck of claim 12 wherein the first dielectric layer is in a range of between about 10 μm and about 5 mm.

14. The electrostatic chuck of claim 1, wherein the ceramic chuck body and the porous region include at least one member selected from the group consisting of aluminum nitride, $Al_2O_3$, $Al_2O_3$—$TiO_2$, $Si_3N_4$, SiC, BN, $Y_2O_3$ and an yttrium aluminate.

15. The electrostatic chuck of claim 1, wherein the porous region has a porosity in a range of between about 10% and about 60%.

16. The electrostatic chuck of claim 15, wherein there are at least two porous regions, and wherein the porosity of at least two of the porous regions differs.

17. The electrostatic chuck of claim 1, wherein the porous region has a cylindrical shape.

18. The electrostatic chuck of claim 1, wherein the porous region includes at least one ring.

19. The electrostatic chuck of claim 1, wherein the porous region includes concentric rings.

20. The electrostatic chuck of claim 19, wherein the surface area of a first ring at the chucking surface is greater than that of a second ring, and wherein the porosity of the first ring is less than that of the second ring.

21. The electrostatic chuck of claim 1, further including lift pin holes.

22. An electrostatic chuck, comprising:
a) a chuck body having a back surface and a chucking surface; and
b) at least one porous, fluid-permeable region extending from the back surface to the chucking surface.

23. An electrostatic chuck, comprising:
a) a chuck body having a back surface and a chucking surface; and
b) an electrode within said chuck body,
wherein said chuck body has a porous structure for providing fluid communication between the back surface and the chucking surface.

24. An electrostatic chuck, comprising:
a) a chuck body having a back surface and a chucking surface; and
b) an electrode within said chuck body,
wherein said chuck body has a at least one porous region, integrated with said chuck body and extending from the back surface to the chucking surface.

25. An electrostatic chuck, comprising:
a) a chuck body having a back surface and a chucking surface; and
b) an electrode within said chuck body,
wherein said chuck body has at least one porous region at the back surface, said porous region being integrated with said chuck body and extending into the chuck body, and at least one conduit between the porous region and the chucking surface.

26. An electrostatic chuck, comprising:
a) a chuck body having a back surface and a chucking surface; and
b) an electrode within said chuck body,
wherein said chuck body has at least one porous region at the back surface, said porous region being integrated with said chuck body and extending into the chuck body, and at least two conduits between the porous region and the chucking surface.

27. An electrostatic chuck, comprising:
a) a chuck body having a back surface and a chucking surface; and
b) an electrode within said chuck body,
wherein said chuck body has at least one porous region at the chucking surface, said porous region being integrated with said chuck body and extending into the chuck body, and at least one conduit between the porous region and the back surface.

28. The electrostatic chuck of claim 27 wherein the porous region extends through the electrode.

29. A method of producing an electrostatic chuck, comprising the steps of:
a) forming a green body of an electrostatic chuck body, said green body including at least one region that includes removable particles;
b) heating said green body to form the electrostatic chuck body; and
c) removing the particles, thereby forming a porous region in said electrostatic chuck body.

30. The method of claim 29, wherein the removable particles are removed by heating.

31. The method of claim 29, wherein the removable particles are removed by treatment with a decomposing chemical agent.

32. The method of claim 29 wherein the removable particles include a refractory metal.

33. A method of producing an electrostatic chuck, comprising the steps of:
a) forming in a green body of an electrostatic chuck body at least one green region that, following densification of the green body, will be porous; and
b) densifying the green body, thereby forming the ceramic electrostatic chuck body, said ceramic electrostatic chuck body including at least one porous region.

34. The method of claim 33, wherein the green region formed includes a sintering aid.

35. The method of claim 34, wherein the green region formed includes at least one sintering aid selected from the group consisting of $Y_2O_3$, a calcium halide, a calcium oxide, a calcium nitrate, $Cr_2O_3$, $SiO_2$ and BN.

36. The method of claim 35, wherein the green region formed includes $Y_2O_3$.

37. The method of claim 33, wherein the green region formed includes a polymer component that, during densification of the green body, will decompose, thereby leaving pores and forming a porous region of the electrostatic chuck body.

38. The method of claim 37, wherein the green region formed includes at least one polymer selected from the group consisting of polymethylmethacrylate, polystyrene, polyethylene, acrylic resin, vinyl resin, cellulose acetate, cured epoxy resin, polyimide resin, co-polymer, ter-polymer and crossed-linked modifications thereof.

39. The method of claim 33, wherein the green region formed includes at least one member from the group consisting of $Al_2O_3$, $Al_2O_3$—$TiO_2$, $Si_3N_4$, SiC, BN, $Y_2O_3$ and an yttrium aluminate.

40. The method of claim 33, wherein the green region formed includes at least one pre-densified portion.

41. The method of claim 33, wherein the green body is densified by pressureless sintering.

42. The method of claim 33, wherein the green body is densified by hot pressing.

43. A method of producing an electrostatic chuck, comprising the steps of:
a) forming, in a dense ceramic body of an electrostatic chuck, at least one porous plug, said porous plug including a bonding agent; and
b) heating said porous plug, thereby integrating the porous plug with the dense ceramic body of the electrostatic chuck.

44. A method of modifying a wafer's process temperature, comprising the steps of:
a) supporting the wafer onto a chucking surface of a ceramic electrostatic chuck, said electrostatic chuck including a porous conduit extending from a back surface of said electrostatic chuck to said chucking surface; and
b) directing a heat transfer fluid through the porous conduit to the chucking surface, thereby modifying the wafer's process temperature.

45. A method of modifying a wafer's process temperature, comprising the steps of:
a) supporting the wafer on a chucking surface of an electrostatic chuck, said electrostatic chuck including a conduit extending from said back surface to said chucking surface, said conduit including a porous region; and
b) directing a heat transfer fluid through the conduit to the chucking surface, thereby modifying the wafer's process temperature.

* * * * *